(12) United States Patent
Du (10) Patent No.: US 11,108,016 B2
(45) Date of Patent: Aug. 31, 2021

(54) DISPLAY SCREENS AND DISPLAY DEVICES (71) Applicant: YUNGU (GU'AN) TECHNOLOGY CO., LTD., Langfang (CN)

(72) Inventor: Yang Du, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 31 days.

(21) Appl. No.: 16/724,202

(22) Filed: Dec. 21, 2019

(65) Prior Publication Data
US 2020/0127223 A1 Apr. 23, 2020

Related U.S. Application Data (63) Continuation of application No. PCT/CN2019/084860, filed on Apr. 28, 2019.

(30) Foreign Application Priority Data

Jul. 16, 2018 (CN) .......................... 201810778595.1

(51) Int. Cl.
H01L 29/08 (2006.01)
H01L 51/52 (2006.01)
(Continued)

(52) U.S. Cl.
CPC ........ H01L 51/525 (2013.01); H01L 27/3246 (2013.01); H01L 27/3258 (2013.01);
(Continued)

(58) Field of Classification Search
CPC ............... H01L 51/525; H01L 51/0097; H01L 51/5281; H01L 27/3246; H01L 27/3258
See application file for complete search history.

(56) References Cited

U.S. PATENT DOCUMENTS

2007/0120468 A1* 5/2007 Lee .......................... H01L 51/56
313/504
2009/0142984 A1* 6/2009 Logunov ............. H01L 51/5246
445/25
(Continued)

FOREIGN PATENT DOCUMENTS

CN 106449702 A 2/2017
CN 106910841 A 6/2017
(Continued)

OTHER PUBLICATIONS

CN First Office Action with Search Report dated Sep. 3, 2019 in the corresponding CN application (application No. 201810778595.1).

Primary Examiner — Phuc T Dang
(74) Attorney, Agent, or Firm — Kilpatrick Townsend & Stockton LLP (57) ABSTRACT The present disclosure relates to a display screen and a display device. The display screen includes a display area, and the display area includes a pixel area and a non-pixel area located around the pixel area. The display screen includes a plurality of film layers stacked in sequence. The plurality of film layers are provided with at least one support pillar therein. The support pillar is located in the non-pixel area and is embedded in at least two film layers along a longitudinal direction orthogonal to a surface of the display screen. In addition, a display device including the aforementioned display screen is provided.

17 Claims, 6 Drawing Sheets (51) Int. Cl.
*H01L 27/32* (2006.01)
*H01L 51/00* (2006.01)

(52) U.S. Cl.
CPC ...... *H01L 27/3265* (2013.01); *H01L 51/0097* (2013.01); *H01L 51/5281* (2013.01); *H01L 2251/5338* (2013.01)

(56) References Cited

U.S. PATENT DOCUMENTS

| | | |
|---|---|---|
| 2014/0141545 A1 | 5/2014 | Lee et al. |
| 2014/0353630 A1* | 12/2014 | Baek .................. H01L 27/3262 257/40 |
| 2015/0108512 A1* | 4/2015 | Shimayama .......... H01L 51/525 257/88 |
| 2017/0154935 A1 | 6/2017 | Yu |
| 2017/0372113 A1* | 12/2017 | Zhang .................. G06K 9/0036 |
| 2019/0165072 A1 | 5/2019 | Wang |

FOREIGN PATENT DOCUMENTS

| | | |
|---|---|---|
| CN | 106920826 A | 7/2017 |
| CN | 107818988 A | 3/2018 |
| CN | 109004003 A | 12/2018 |

* cited by examiner

DISPLAY SCREENS AND DISPLAY DEVICES

CROSS-REFERENCES TO RELATED APPLICATIONS

This application is a continuation application of International Application No. PCT/CN2019/084860, filed on Apr. 28, 2019, which claims the priority benefit of Chinese Patent Application No. 201810778595.1, titled "DISPLAY SCREENS AND DISPLAY DEVICES" and filed on Jul. 16, 2018. The entireties of these applications are incorporated by reference herein for all purposes.

TECHNICAL FIELD

The present disclosure relates to the field of display technologies.

BACKGROUND

With the development of display technology, consumers are increasingly demanding high quality display screens. Unfortunately, conventional display technology is inadequate.

SUMMARY

According to various embodiments disclosed in the present disclosure, a display screen and a display device are provided.

A display screen is provided. The display screen includes a display area, and the display area includes a pixel area and a non-pixel area located around the pixel area; the display screen includes a plurality of film layers stacked in sequence. The plurality of film layers is provided with at least one support pillar therein. The support pillar is located in the non-pixel area and is embedded in at least two film layers along a longitudinal direction orthogonal to a surface of the display screen.

In one of the embodiments, the support pillar is integrally formed.

In one of the embodiments, there are a plurality of the support pillars, and the plurality of support pillars are distributed in different film layers.

In one of the embodiments, the support pillar has a length of about 5.8 μm to about 7.2 μm.

In one of the embodiments, a ratio of a sum of projection areas of the plurality of support pillars on a surface of the film layer to an area of the pixel area ranges from 1:1 to 1:10.

In one of the embodiments, the support pillar is made of polyimide or silicone.

In one of the embodiments, the display screen includes a plurality of sub-pixels, and a periphery of each of the sub-pixels is provided with a plurality of support pillars uniformly distributed.

In one of the embodiments, each of the sub-pixels has an opening in a rectangular shape. The periphery of each of the sub-pixels is provided with two first support pillars and two second support pillars. The two first support pillars are symmetrically disposed along a line connecting midpoints of short sides of the rectangle, and the two second support pillars are symmetrically disposed along a line connecting midpoints of long sides of the rectangular.

In one of the embodiments, two adjacent sub-pixels share one of the plurality of support pillars.

In one of the embodiments, the plurality of film layers include a support substrate, a buffer layer, a first interlayer insulating layer, an intra-capacitor insulating dielectric layer, a second interlayer insulating layer, a planarization layer, a pixel defining layer, and a thin film encapsulation layer; a top end of the support pillar is flush with a top end of the pixel defining layer, and a bottom end of the support pillar is located on the support substrate.

In one of the embodiments, the support substrate is made of polyimide.

In one of the embodiments, the support pillar includes a plurality of superimposed sub-support pillars.

In one of the embodiments, the plurality of sub-support pillars are made of the same material.

In one of the embodiments, a cross-section of the support pillar parallel to a surface of the film layer has a shape of circular, elliptical, rectangular, or triangular.

In one of the embodiments, the support pillar has a mesh shape.

In one of the embodiments, the support pillar is provided with meshes, the display screen includes a plurality of sub-pixels located in the meshes of the support pillar.

In addition, a display device is further provided, which includes the aforementioned display screen.

According to the display screen and the display device to which the technical solution of the present disclosure is applied, since the support pillar is embedded in at least two film layers, when the display screen is hit by a heavy object, the stress is more easily propagated along the axial direction of the support pillar, and the probability of transverse propagation of the stress in the film layer is reduced, so that the damage and peeling of the film layers are avoided, thereby avoiding the display failure.

DETAILED DESCRIPTION OF THE INVENTION

As mentioned above, conventional display have been inadequate. For example, when a conventional display screen is hit by a heavy object, the display screen is likely to fail. The above objects, features, and advantages of the present disclosure will become more apparent by describing in detail embodiments thereof with reference to the accompanying drawings. In the following description, numerous specific details are set forth in order to provide a thorough understanding of the present disclosure. However, the present disclosure can be implemented in many other ways than those described herein, and such modifications may be made by those skilled in the art without departing from the scope of the disclosure, which is therefore not to be limited to the specific embodiments disclosed below.

Figure 1:
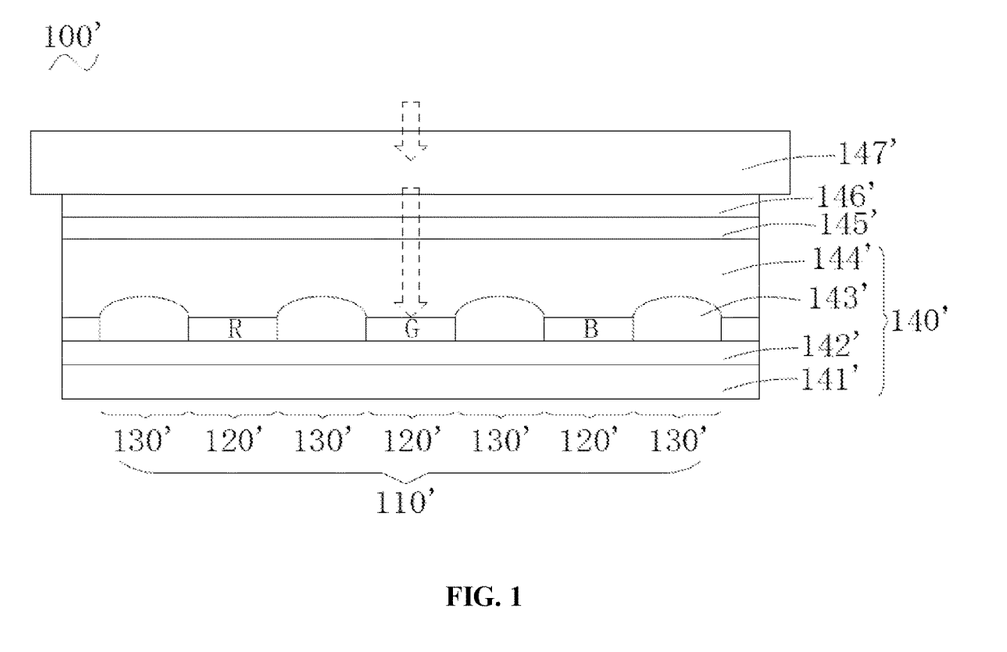
FIG. 1 is a schematic view of a display screen.

Referring to FIG. 1, a display screen 100' includes a display area 110'. The display area 110' includes a pixel area 120' and a non-pixel area 130' located around the pixel area 120'. The display screen 100' includes a plurality of film layers 140 stacked in sequence. The plurality of film layers 140' may include, for example, a support substrate 141', an array film layer 142', an organic adhesive layer 143', a thin film encapsulation layer 144', and the like. The display screen 100' may further include other components such as a polarizer 145' and a cover plate 147' located on the plurality of film layers 140', and may further include an optical adhesive 146' located between the polarizer 145' and the cover plate 147'.

Reliability of flexible products still is a main problem affecting product yield, and particularly in a reliability test of a flexible screen, when a 32.65 g falling ball (a steel ball with a diameter of 20 mm and a falling height of 2 cm to 62.5 cm) is used to hit the screen along a direction indicated by an arrow in FIG. 1, defects such as dark spots, bright spots, colored spots, and the like appear in the hit area instantaneously, so that the flexible screen cannot meet application requirements of the market.

The inventors of the present disclosure have obtained the following possible reasons after the analysis to cause the aforementioned defects:

1. the falling ball hits a cathode, the cathode fails and dark spots appear;
2. a certain sub-pixel is destroyed, and a colored spot appears;
3. the falling ball hits an anode, causing the anode to fail;
4. the falling ball hits a panel, and peeling easily occurs between the film layers with poor adhesion, in which the cathode and the underlying film layer are most easily peeled off.

Therefore, the present disclosure provides a display screen and a display device capable of avoiding display failure when hit by a heavy object.

Figure 2:
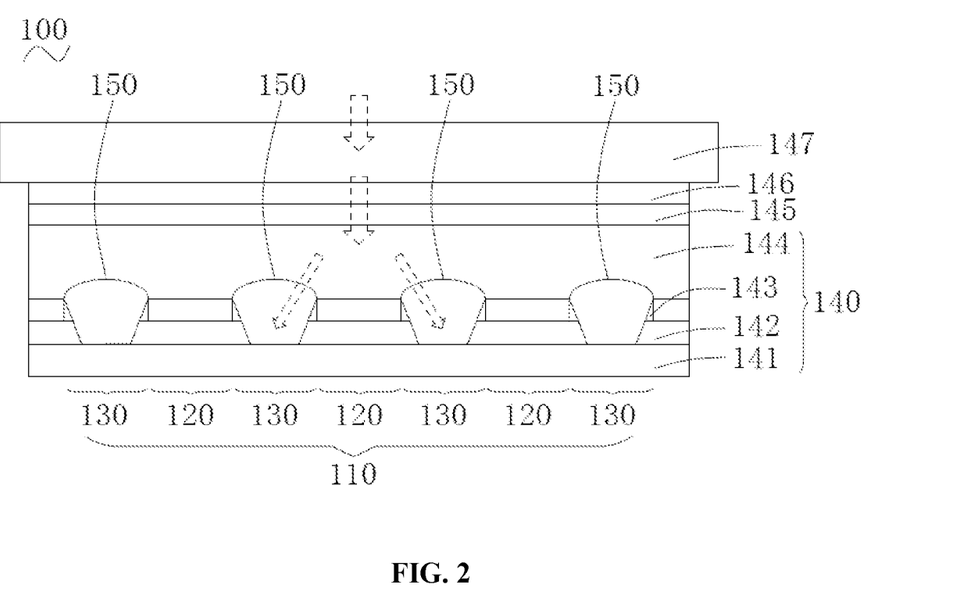
FIG. 2 is a front elevational view of a display screen in accordance with an embodiment of the present disclosure.
Figure 3:
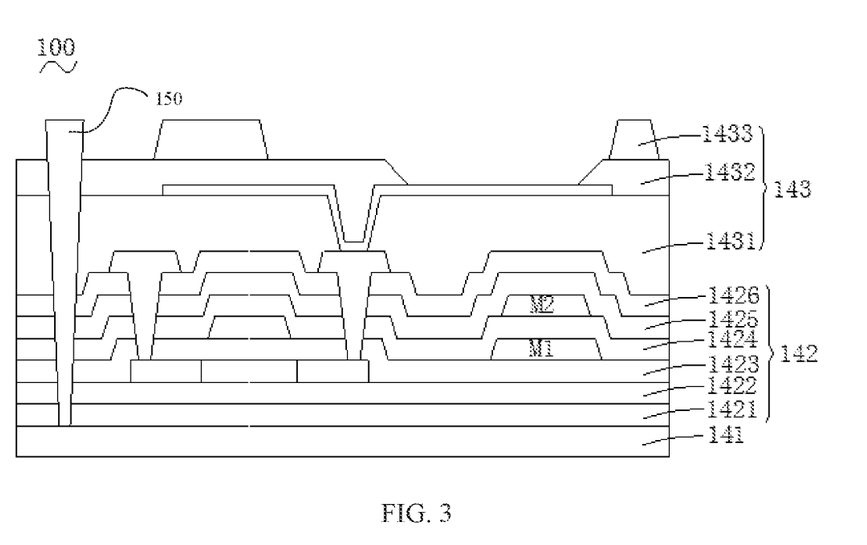
FIG. 3 is a side view of a display screen in accordance with an embodiment of the present disclosure.
Figure 4:
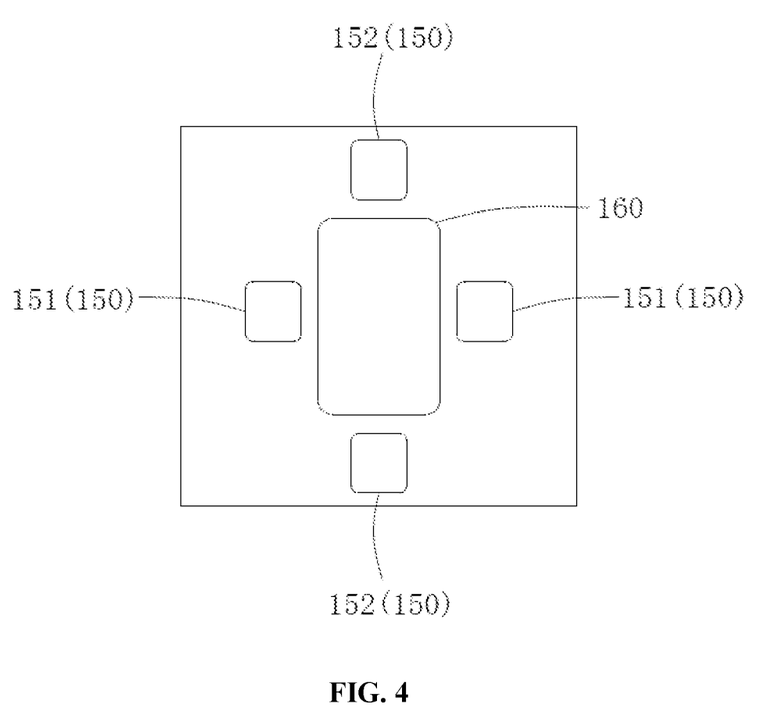
FIG. 4 is a schematic view showing a distribution of support pillars in a display screen in accordance with an embodiment of the present disclosure.

Referring to FIG. 2 to FIG. 4, the display screen 100 in accordance with an embodiment of the present disclosure includes a display area 110. The display area 110 includes a pixel area 120 and a non-pixel area 130 located around the pixel area 120.

The display screen 100 may further include a bezel area (not shown) surrounding the display area 110 in addition to the display area 110. The pixel area 120 refers to an area in the display screen 100 where a plurality of sub-pixels are located. The non-pixel area 130 refers to an area other than the pixel area 120 in the display area 110, for example, an area corresponding to a pixel defining layer (PDL).

The display screen 100 includes a plurality of film layers 140 stacked in sequence. The plurality of film layers 140 are provided with at least one support pillar 150 therein. The support pillar 150 is located in the non-pixel area 130, and the support pillar 150 is embedded in at least two film layers along a longitudinal direction orthogonal to a surface of the display screen 100.

Referring to FIG. 2, the plurality of film layers 140 include a support substrate 141, an array film layer 142, an organic adhesive layer 143, and a thin film encapsulation layer 144. The support substrate 141 may be a flexible substrate such as polyimide (PI).

Referring to FIG. 3, the array film layer 142 includes a first buffer layer 1421, a second buffer layer 1422, a first interlayer insulating layer (GI) 1423, an intra-capacitor insulating dielectric layer (CI) 1424, a second interlayer insulating layer (ILD1) 1425, and a third interlayer insulating layer (ILD2) 1426. The first buffer layer 1421 is silicon nitride (SiNx), and the second buffer layer 1422 is silicon oxide (SiOx). Certainly, the materials of the first buffer layer 1421 and the second buffer layer 1422 are not limited thereto. For example, the first buffer layer 1421 may also be silicon oxide, and the second buffer layer 1422 may also be made of silicon nitride. The array film layer 142 is not limited thereto.

The organic adhesive layer 143 includes a planarization layer (PLN) 1431, a first pixel defining layer (PDL) 1432, a second pixel defining layer (SPC) 1433, and the like. The first pixel defining layer (PDL) 1432 and the second pixel defining layer (SPC) 1433 may also be referred to as isolation pillars. The organic adhesive layer 143 is not limited thereto.

In addition, the display screen 100 further includes other components such as a polarizer (POL) 145 and a cover plate (Cover film/glass) 147 located on the plurality of film layers 140, and may further include an optical adhesive 146 located between the polarizer 145 and the cover plate 147.

The support pillar 150 is embedded in at least two film layers along the longitudinal direction, which means that the support pillar 150 may be embedded in two or more film layers along the longitudinal direction. Since the display screen 100 has a planar structure as a whole, the longitudinal direction refers to the direction orthogonal to the surface of the display screen 100, that is, a direction extending from the display surface of the display screen 100 towards the back surface or a reverse direction. Embedding refers to at least a portion of the support pillar 150 extending into at least two film layers. When the support pillar 150 is embedded in three or more film layers along the longitudinal direction, the support pillar 150 penetrates the film layer between the two film layers at the edge.

Moreover, the film layers at both ends of the plurality of film layers 140 are the support substrate 141 and the thin film encapsulation layer 144, respectively. A bottom end of the support pillar 150 may be embedded in the support substrate 141, but should not penetrate the support substrate 141, so as to prevent external moisture from penetrating into an interior of the display screen 100 from the bottom of the display screen 100. Similarly, a top end of the support pillar 150 may be embedded in the thin film encapsulation layer 144, but should not penetrate the thin film encapsulation layer 144, thereby avoiding encapsulation failure.

In the display screen of the present disclosure, since the support pillar 150 is located in the non-pixel area 130, the display of each sub-pixel is not affected. Since the support pillar 150 is embedded in at least two film layers along the longitudinal direction, when the display screen is hit by a heavy object, the stress is more easily propagated along an axial direction of the support pillar 150, and the probability of transverse propagation of the stress in the film layer is reduced, so that the functional layer in the pixel area can be prevented from being damaged due to the transverse propagation of the stress in the film layer, and the peeling between two adjacent film layers can be avoided, thereby avoiding display failure.

Referring to FIG. 3, in the display screen 100 in accordance with an embodiment, a top end of the support pillar 150 is flush with a top end of the second pixel defining layer 1433, and a bottom end of the support pillar 150 is located on the support substrate 141. Therefore, the support pillar 150 has a long extension distance inside the film layer, when hit by a heavy object, a distance of stress propagating along the axial direction of the support pillar 150 is long, so that the probability of transverse propagation of the stress in the film layer is effectively reduced, and the damage to the cathode, the anode, and the like due to the transverse propagation of the stress in the film layer is avoided, thereby avoiding display failure.

In one embodiment, the support pillar 150 is integrally formed. The support pillar 150 is integrally formed, which means that the support pillar 150 is manufactured by a single process, and the support pillar 150 thus obtained is integrated. When the display screen is hit by a heavy object, the stress is more easily propagated along the axial direction of the integrally formed support pillar 150, and the probability of transverse propagation of the stress in the film layer is reduced, so that the functional layer in the pixel area can be prevented from being damaged due to the transverse propagation of the stress in the film layer, and the peeling between two adjacent film layers can be avoided, thereby avoiding display failure.

In the display screen of the present disclosure, the form of the support pillar is not limited thereto. The support pillar may also include a plurality of superimposed sub-support pillars (not shown), preferably these sub-support pillars are made of the same material. Therefore, when the display screen is stressed, the stress is easily propagated along the axial direction of the support pillar, and the probability of transverse propagation of the stress in the film layer may also be reduced, so that display failure is avoided.

In one embodiment, there are a plurality of support pillars 150, and a ratio of a sum of projection areas of the plurality of support pillars 150 on a surface of the film layer to an area of the pixel area 120 ranges from 1:1 to 1:10. At this case, when the display screen 100 is hit by a heavy object, the stress can be rapidly transferred downward through these support pillars 150, so that the probability of transverse propagation of the stress in the film layer is effectively reduced, and the damage to the functional layers, such as, the cathode, the anode, and the like due to the transverse propagation of the stress in the film layer is avoided, thereby avoiding display failure.

The ratio of the sum of the projection areas of the plurality of support pillars 150 on the surface of the film layer to the area of the pixel area 120 is not limited thereto, and may be set without affecting the pixel light emission.

In one embodiment, the support pillar 150 is made of polyimide or silicone. A silicone, that is, an organosilicon compound, refers to a compound containing a Si—C bond and having at least one organic group directly linked to a silicon atom. The support pillars 150 made of these kinds of materials have a certain support strength, and when hit by a heavy object, the support pillars 150 made of these kinds of materials can bear a certain stress and transfer the portion of the stress downward along the axial direction of the support pillars 150. In addition, the manufacturing temperature of the support pillars 150 made of these kinds of materials is not high, thereby avoiding the adverse effect on the organic functional layer due to the over-high temperature. The support pillar 150 may also be made of other organic polymers that do not affect the performance of the display screen.

In one embodiment, referring to FIG. 4 together, the display screen 100 includes a plurality of sub-pixels 160, and a periphery of each of the sub-pixels 160 is provided with the plurality of support pillars 150 uniformly distributed. The uniform distribution means that the support pillars are regularly distributed at the periphery of the sub-pixel 160 and the distance between two adjacent support pillars is not much different. Therefore, the stress when the display screen is hit by the heavy object can be uniformly dispersed, and the display failure can be effectively avoided.

In one embodiment, each of the sub-pixels 160 has an opening in a rectangular shape, and the periphery of each of the sub-pixels 160 is provided with two first support pillars 151 (150) and two second support pillars 152 (150). Referring to FIG. 4, the two first support pillars 151 (150) are symmetrically disposed along a line connecting midpoints of short sides of the rectangle, and the two second support pillars 152 (150) are symmetrically disposed along a line connecting midpoints of long sides of the rectangular. In this way, the sub-pixel 160 can be protected in an all-round way, when the display screen is hit by a heavy object, the stress can be rapidly transferred along the axial direction of the support pillars 150 around the periphery, thereby avoiding damage to the sub-pixel 160 and effectively avoiding the display failure.

In one embodiment, two adjacent sub-pixels 160 share one support pillar 150. This allows for a reasonable layout of the support pillars 150, in which one support pillar 150 can protect the sub-pixels on both sides.

In one embodiment, the support pillar 150 has a length of about 5.8 μm to about 7.2 μm. When the support pillar 150 has the length of 5.8 μm to 7.2 μm, the stress when the display screen is hit by a heavy object is transferred downward along the axial direction in the support pillar 150 for a longer path, so that the stress can be sufficiently transferred to the lower side along the axial direction, and the sub-pixels and the like can be fully prevented from being damaged due to the stress transferring along the transverse direction, thereby effectively avoiding the display failure.

In the display screen of the present disclosure, the position of the support pillar is not limited thereto. The support pillar is embedded in at least two film layers along the longitudinal direction. For example, in alternative embodiments, the support pillars can be embedded in two or more film layers. The two film layers may be any two adjacent film layers. For example, the support pillar is embedded in the support substrate and the first buffer layer, or embedded in the second pixel defining layer and the thin film encapsulation layer, and the like. In addition, the position of the support pillar needs to avoid the circuit design of the array film layer, so as to avoid affecting the routing.

In one embodiment, there are a plurality of support pillars, and the plurality of support pillars are distributed in different film layers. When the display screen is hit by a heavy object, the support pillars distributed in different film layers can play different supporting roles, so that damage caused by the stress on a certain film layer being too large to be transferred downward or peeling between the certain film layer and adjacent film layers is avoided, thereby avoiding the display failure.

According to the display screen to which the technical solution of the present disclosure is applied, since the support pillar is embedded in at least two film layers, when the display screen is hit by a heavy object, the stress is more easily propagated along the axial direction of the support pillar, and the probability of transverse propagation of the stress in the film layer is reduced, so that the damage and peeling of the film layers are avoided, thereby avoiding the display failure.

Figure 5:
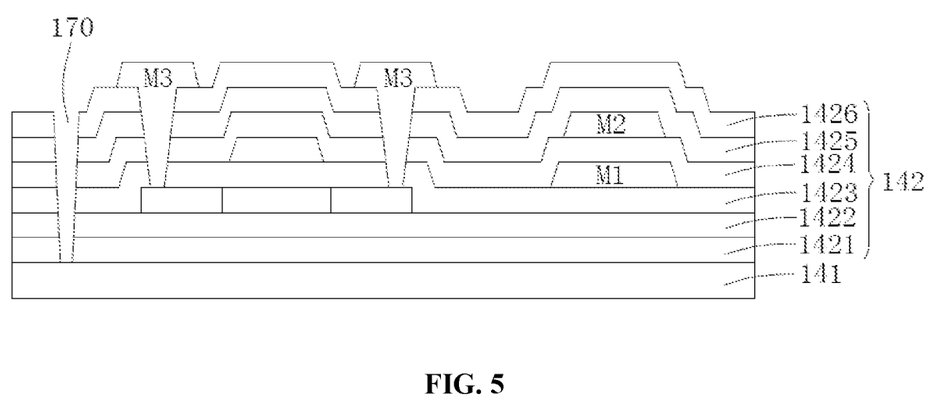
FIG. 5 is a schematic view of a display screen after grooving a film layer thereof in accordance with an embodiment of the present disclosure.

When the aforementioned display screen is manufactured, a position where the support pillar is needed is grooved. For example, referring to FIG. 5, first, after M3 is completed, the array film 142 is grooved to obtain a groove 170. The grooving may be performed by using processes such as a physical etching, a chemical etching, or the like, wherein the chemical etching includes plasma etching, laser etching, or the like. Thereafter, the organic adhesive layer 143 is formed on the grooved array film layer 142, and then the material deposited in the groove 170 is etched away. The display screen shown in FIG. 2 can be finally obtained.

Figure 6:
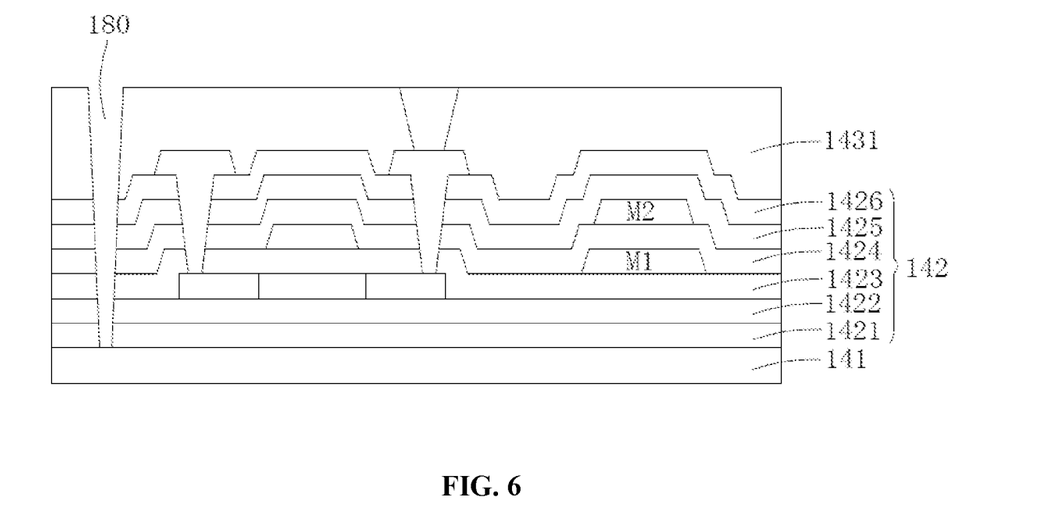
FIG. 6 is a schematic view of a display screen after grooving a film layer thereof in accordance with another embodiment of the present disclosure.

Any one of the film layers in the process of manufacturing the plurality of film layers 140 may be grooved. For example, the planarization layer (PLN) 1431 may also be formed and then grooved to obtain a groove 180, referring to FIG. 6. The grooving may also be performed by using processes such as a physical etching, a chemical etching, or the like, wherein the chemical etching includes plasma etching, laser etching, or the like. Thereafter, the first pixel defining layer (PDL) 1432 and the second pixel defining layer (SPC) 1433 are formed on the grooved planarization layer 1431, and then the material deposited in the groove 180 is etched away. The display screen shown in FIG. 2 can also be finally obtained.

A display device in accordance with an embodiment includes the aforementioned display screen. The display screen is preferably an organic light-emitting diode (OLED) display screen.

In one embodiment, a cross-section of the support pillar 150 parallel to the surface of the film layer has a shape of circular, elliptical, rectangular, or triangular. These cross-sectional shapes are relatively regular, which facilitates the downward transfer of stress along the axial direction of the support pillar 150. The cross-section of the support pillar 150 parallel to the surface of the film layer preferably has the shape of circular. The support pillar 150 having a circular cross-section is simple in manufacturing process, and does not require angular control of an included angle of the edge. The shape of the cross-section of the support pillar 150 parallel to the surface of the film layer is not limited thereto, and may be other shapes.

In addition, the support pillar can also be provided in a mesh shape, that is, the support pillar is integrated. The sub-pixels are located in the meshes of the mesh support pillar, so that the sub-pixels can be protected in an all-round way and the display failure is fully avoided.

The display device to which the technical solution of the present disclosure is applied includes the aforementioned display screen. Since the support pillar is embedded in at least two film layers, when the display screen is hit by a heavy object, the stress is more easily propagated along the axial direction of the support pillar, and the probability of transverse propagation of the stress in the film layer is reduced, so that the damage and peeling of the film layers are avoided, thereby avoiding the display failure.

Although the respective exemplary embodiments have been described one by one, it shall be appreciated that the respective exemplary embodiments will not be isolated. Those skilled in the art can apparently appreciate upon reading the disclosure of this application that the respective technical features involved in the respective exemplary embodiments can be combined arbitrarily between the respective exemplary embodiments as long as they have no collision with each other. Of course, the respective technical features mentioned in the same exemplary embodiment can also be combined arbitrarily as long as they have no collision with each other.

The foregoing descriptions are merely specific exemplary embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure. Therefore, the protection scope of the present disclosure shall be subject to the protection scope of the appended claims.

The invention claimed is:

1. A display screen, comprising a display area, the display area comprising a pixel area and a non-pixel area located around the pixel area;
the display screen comprising a plurality of film layers stacked in sequence, the plurality of film layers being provided with at least one support pillar therein, the support pillar being located in the non-pixel area and being embedded in at least two film layers along a longitudinal direction orthogonal to a surface of the display screen;
wherein the support pillar is configured to reduce transverse propagation of stress in the plurality of film layers for enhanced reliability of the display screen.

2. The display screen according to claim 1, wherein the support pillar is integrally formed.

3. A display screen, comprising:
a display area comprising a pixel area and a non-pixel area located around the pixel area;
a plurality of film layers stacked in sequence, the plurality of film layers being provided with at least one support pillar therein, the support pillar being located in the non-pixel area and being embedded in at least two film layers along a longitudinal direction orthogonal to a surface of the display screen;
wherein there are a plurality of the support pillars, and the plurality of support pillars are distributed in different film layers.

4. The display screen according to claim 1, wherein the support pillar has a length of about 5.8 µm to about 7.2 µm.

5. The display screen according to claim 3, wherein a ratio of a sum of projection areas of the plurality of support pillars on a surface of the film layer to an area of the pixel area ranges from 1:1 to 1:10.

6. The display screen according to claim 1, wherein the support pillar is made of polyimide or silicone.

7. The display screen according to claim 1, wherein the display screen comprises a plurality of sub-pixels, and a periphery of each of the sub-pixels is provided with a plurality of support pillars uniformly distributed.

8. The display screen according to claim 7, wherein each of the sub-pixels has an opening in a rectangular shape, the periphery of each of the sub-pixels is provided with two first support pillars and two second support pillars; the two first support pillars are symmetrically disposed along a line connecting midpoints of short sides of the rectangle, and the two second support pillars are symmetrically disposed along a line connecting midpoints of long sides of the rectangular.

9. The display screen according to claim 7, wherein two adjacent sub-pixels share one of the plurality of support pillars.

10. The display screen according to claim 1, wherein the plurality of film layers comprise a support substrate, a buffer layer, a first interlayer insulating layer, an intra-capacitor insulating dielectric layer, a second interlayer insulating layer, a planarization layer, a pixel defining layer, and a thin film encapsulation layer;
a top end of the support pillar is flush with a top end of the pixel defining layer, and a bottom end of the support pillar is located on the support substrate.

11. The display screen according to claim 1, further comprising a support substrate made of polyimide.

12. The display screen according to claim 1, wherein the support pillar comprises a plurality of superimposed sub-support pillars.

13. The display screen according to claim 11, wherein the plurality of sub-support pillars are made of the same material.

14. The display screen according to claim 1, wherein a cross-section of the support pillar parallel to a surface of the film layer has a shape of circular, elliptical, rectangular, or triangular.

15. The display screen according to claim 1, wherein the support pillar has a mesh shape.

16. The display screen according to claim 1, wherein the support pillar is provided with meshes, the display screen comprises a plurality of sub-pixels located in the meshes of the support pillar.

17. A display device, comprising a display screen the display screen, comprising:
- a display area comprising a pixel area and a non-pixel area located around the pixel area;
- a plurality of film layers stacked in sequence, the plurality of film layers being provided with at least one support pillar therein, the support pillar being located in the non-pixel area and being embedded in at least two film layers along a longitudinal direction orthogonal to a surface of the display screen;
- wherein the support pillar is configured to reduce transverse propagation of stress in the plurality of film layers for enhanced reliability of the display screen.

\* \* \* \* \*